United States Patent
Lee et al.

[11] Patent Number: 5,872,047
[45] Date of Patent: Feb. 16, 1999

[54] METHOD FOR FORMING SHALLOW JUNCTION OF A SEMICONDUCTOR DEVICE

[75] Inventors: Kil Ho Lee; Sang Ho Yu, both of Ichon, Rep. of Korea

[73] Assignee: Hyundai Electronics Industries Co., Ltd., Ichon, Rep. of Korea

[21] Appl. No.: 871,850

[22] Filed: Jun. 9, 1997

[30] Foreign Application Priority Data

Jun. 24, 1996 [KR] Rep. of Korea ............. 96-23252

[51] Int. Cl.⁶ ..................... H01L 21/425
[52] U.S. Cl. ............ 438/530; 438/224; 438/228; 438/231
[58] Field of Search ................. 438/223, 224, 438/225, 228, 231, 232, 289, 530, 595

[56] References Cited

U.S. PATENT DOCUMENTS

| | | | |
|---|---|---|---|
| 5,273,914 | 12/1993 | Miyajima et al. | 438/231 |
| 5,366,922 | 11/1994 | Aoki et al. | 438/232 |
| 5,384,279 | 1/1995 | Stolmeijer et al. | 438/450 |
| 5,407,847 | 4/1995 | Hayden et al. | 438/305 |
| 5,413,945 | 5/1995 | Chien et al. | 438/231 |
| 5,563,093 | 10/1996 | Koda et al. | 438/232 |

*Primary Examiner*—Charles Bowers
*Assistant Examiner*—Jack Chen
*Attorney, Agent, or Firm*—Thelen Reid & Priest LLP

[57] ABSTRACT

A method for forming a shallow junction of a semiconductor device, characterized by a rapid thermal process executed to considerably decrease the density of the point defects which may be caused by ion implantation. With it, a junction which is much shallower, with lower sheet resistance and less junction leakage current can be obtained even under conventional ion implantation and tube treatment conditions. This contributes to an improvement in the production yield of a semiconductor device. By virtue of the elimination of the point defects, the limits in selecting the tube thermal treatment temperature and time for planarizing the subsequent interlayer insulating film can be relieved, so that process allowance can be secured, thereby improving the reliability of the semiconductor device and allowing the high integration of the semiconductor device.

9 Claims, 3 Drawing Sheets

METHOD FOR FORMING SHALLOW JUNCTION OF A SEMICONDUCTOR DEVICE

BACKGROUND OF THE INVENTION

1. Field of the Invention

The present invention relates, in general, to a method for a shallow junction of a semiconductor device and, more particularly, to the use of a rapid thermal process in which a semiconductor substrate implanted with ions through a thin insulating film is thermally treated at a high temperature for a short time under the condition of elevating the temperature at a great speed, in forming a shallow source/drain junction region.

2. Description of the Prior Art

Usually, the ultra high integration of semiconductor devices requires a significant reduction in the area of source/drain region. Conventionally, the formation of source/drain junction is accomplished by a preamorphization process in which heavy ions, such as arsenic, silicon or germanium, are implanted before the implantation of p type dopants, such as boron and boronfluoride ions, to prevent the channeling of boron or by a subsequent thermal treatment at a low temperature for a short time.

In order to better understand the background of the invention, a description will be given of a conventional method for forming a shallow junction of semiconductor device, in conjunction with FIG. 1, below.

First, a N-well 43 is formed in the upper part of a semiconductor substrate 41, followed by the sequential formation of a field oxide film 45, a gate oxide film 47, a gate electrode 49 and an oxide film spacer 51 over the N-well 43. The structure thus formed over the semiconductor substrate 41 serves as a mask in an ion-implantation process to form a p$^+$ source/drain junction region 53. The ions are injected through a residual oxide film or intentionally grown thin oxide film 59 which will be formed on the p$^+$ source/drain junction region 53. With the aim of preventing the damage attributable to the channeling effect of the dopant which is boron, the ion implantation and the metal impurities introducible into the Si substrate upon the ion-implantation, the residual oxide film 59 is formed from a thermal oxide film which is used to protect the semiconductor substrate 41 from etching for the formation of the gate electrode or from the residue after the formation of the oxide film spacer 51.

Next, an interlayer insulating film 55 is deposited over a Low pressure CVD-tetraethylorthosilicate (hereinafter referred to as "LPCVD-TEOS"), followed by the deposition of a blanket of a planarization layer 57 over the interlayer insulating film 55. The planarization layer 57 is an insulating film superior in fluidity, such as borophosphosilicate glass (hereinafter referred to as "BPSG").

However, with this conventional method it is very difficult to form a shallow junction satisfying the design rule for very large scale integration, especially p+n junction, for the following reasons.

First, a low energy for BF$_2$ ion implantation is required to form a shallow p+n junction. However, although it is possible for a commercially available high current ion implanter to perform ion implantation at 10 KeV or less, its ion beam current is too low to apply the implanter for the process.

Second, the reduction in the temperature and period in the subsequent thermal process to the ion implantation, which is to make the junction shallow, is advantageous in the aspect of the junctions depth but is limited because there is a critical condition for planarizing the interlayer insulating film, such as BPSG. In addition, such a reduction also reduces dopant activation and defect removal, giving rise to increasing sheet resistance and junction leakage current.

Particularly, it is difficult to prevent the diffusion of boron upon such BF$_2$ ion implantation because the fluorine implanted together makes the semiconductor substrate amorphous, resulting in that after the thermal treatment for the planarization of conventional LPCVD-TEOS and BPSG, defects are widely distributed below the boundary between an initially amorphized region and a non-amorphized region. Further, the defects are highly apt to be in the depletion layer of the junction, which would increase junction leakage current.

Although not shown, other conventional methods can accomplish shallow junction by reducing the temperature and time in the subsequent thermal treatment. However, neither electrical activation of dopant nor removal of defect can be achieved by almost all of them, so that the junction leakage current is very large. Likely, the critical condition for planarizing the interlayer insulating film, such as BPSG, significantly limits the reduction of the temperature and time of the subsequent thermal treatment, restraining the formation of shallow junction.

Owing to the above-mentioned limitation, the semiconductor devices fabricated by the conventional methods are problematic in reliability and high integration.

SUMMARY OF THE INVENTION

An objective of the present invention is to overcome the above problems encountered in prior arts and to provide a method for forming a shallow junction of semiconductor device, As a result of intensive and thorough research, the present inventors have found that the greatest restrictive factor in achieving the shallow junction of semiconductor device is point defects such as Si interstitial and vacancy, both being generated by ion-implantation, and that the silicon internal defects are eliminated when the point defects are inter-coupled (Si interstitial+vacancy=0). Based on the finding, we could remove a large amount of point defects by executing a rapid thermal process at a high temperature elevation speed for a short time after ion implantation, to diffuse point defects without diffusion of dopants and inter-coupling the point defects.

Here, arsenic ions are diffused with the aid of the vacancy and boron ions with the aid of the silicon interstitial. After performing the rapid thermal process for a short time, the point defects are coupled with each other, so their densities are largely reduced. Thus, the arsenic and boron ions can both be restrained from being diffused upon the subsequent tube thermal treatment for the planarization of oxide, at the same time, thereby accomplishing a shallow junction. In addition, residual defects can be lowered in size and density, which results in electric activation of dopants and low junction leakage current.

In accordance with the present invention, the above objective could be accomplished by a provision of a method for forming a shallow junction of semiconductor device, comprising the steps of: constructing a transistor structure including an element-isolating film, a gate oxide and a gate electrode on a semiconductor substrate; depositing a first insulating film at a thickness over an active region of the semiconductor substrate; implanting a predetermined amount of impurity ions at a constant implantation energy in the active region, to form an impurity ion-implanted region;

removing the first insulating film; subjecting the semiconductor substrate to a rapid thermal process for a short time; forming a second insulating film and a third insulating film over the resulting structure, in sequence, the second and the third insulating films serving as an interlayer insulating film and a planarization film, respectively; and subjecting the semiconductor substrate to a tube thermal treatment to change the impurity ion-implanted region into a shallow source/drain junction region.

BRIEF DESCRIPTION OF THE DRAWINGS

Other objectives and aspects of the invention will become apparent from the following description of embodiments with reference to the accompanying drawings in which.

DETAILED DESCRIPTION OF THE PREFERRED EMBODIMENTS

Figure 1:
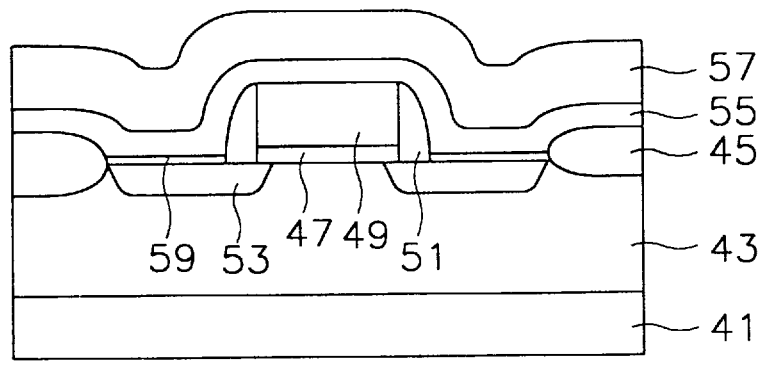
FIG. 1 is a cross sectional view illustrating a conventional method for forming a shallow junction of a semiconductor device.

The application of the preferred embodiments of the present invention is best understood with reference to the accompanying drawings, wherein like reference numerals are used for like and corresponding parts, respectively.

Referring to FIG. 2, stepwise processes of forming a shallow junction in a CMOS transistor are shown.

Figure 2A:
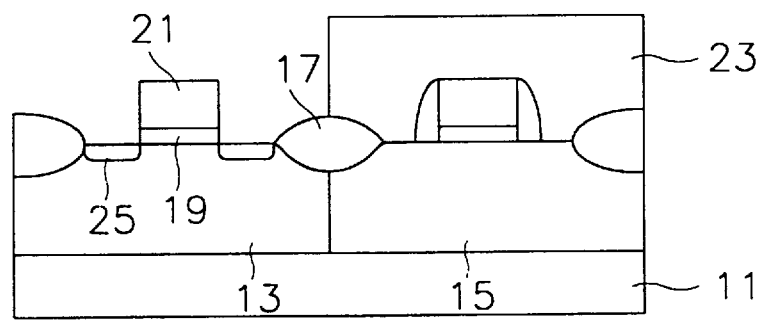
FIGS. 2A through 2D are cross sectional views illustrating a method for forming a shallow junction of semiconductor device, in accordance with the present invention.

First, as shown in FIG. 2A, tri-valent p type ions and pentavalent n type ions are selectively implanted in a semiconductor substrate 11, to form a p well 13 and an n well 15, respectively and an element-isolating film 17 is formed at the boundary between the p well 13 and the n well 15. A gate oxide 19 is formed entirely over the semiconductor substrate 11 after which a conductive such as polysilicon is, then, deposited over the resulting structure. A patterning process results in a gate electrode 21. Then, a first photoresist film pattern 23 is so formed as to cover the n well 15 and serves as a mask for the ion implantation process in which arsenic ions, n type ions, are implanted at a low density in the p well 13 to create a lightly doped arsenic region 25.

Figure 2B:
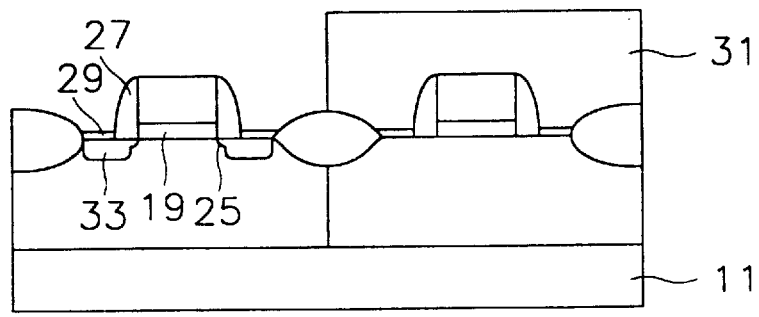

Second, as shown in FIG. 2B, after removing the first photoresist film pattern 23, an oxide which is an insulator, is deposited entirely over the resulting structure and then, subjected to anisotropic etch to form an oxide spacer 27 at the side wall of the gate electrode 21 and a residual oxide 29 about 50–200 Angstrom thick is formed on a part in which a source/drain will be formed. The residual oxide 29 can be formed by not executing the over-etch which accompanies the anisotropic etch. Subsequently, a second photoresist film pattern 31 is formed to cover the n well 15. With the second photoresist film pattern serving as a mask, arsenic ions are implanted at an amount of 1E15–1E16 ions/cm$_2$ and at an implantation energy of 10–40 KeV, to form a highly doped arsenic region 33 in the p well 13. As a result, a lightly doped drain (hereinafter referred to as "LDD") structure in which the high-density arsenic-implanted region 33 contains the lightly doped arsenic region 25 is formed.

Figure 2C:
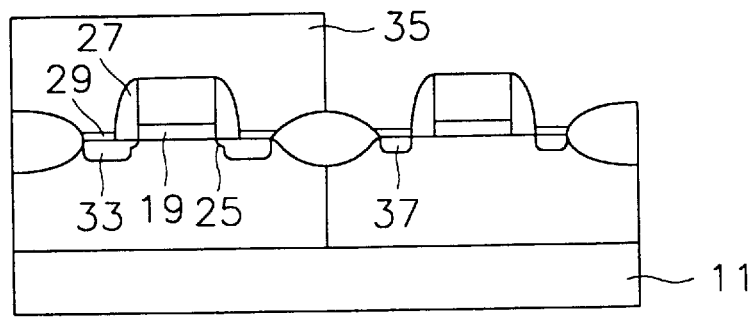

Next, as shown in FIG. 2C, after removing the second photoresist film pattern 31, a third photoresist film pattern 35 is formed to cover the p well 13. In order to form a boronfluoride ion-implanted region 37 in the n well 15, the third photoresist film pattern 35 serves as a mask when implanting boronfluoride ($BF_2$) ions at an amount of 1E15–5E15 ions/cm$^2$ and at an energy of 5–40 KeV in the n well 15.

Instead of boronfluoride ions, boron ions may be used. In this case, the resulting boron ion-implanted region is formed by implanting boron ions at an amount of 1E15–5E15 ions/cm$^2$ and with an energy of 2–10 KeV.

Figure 2D:
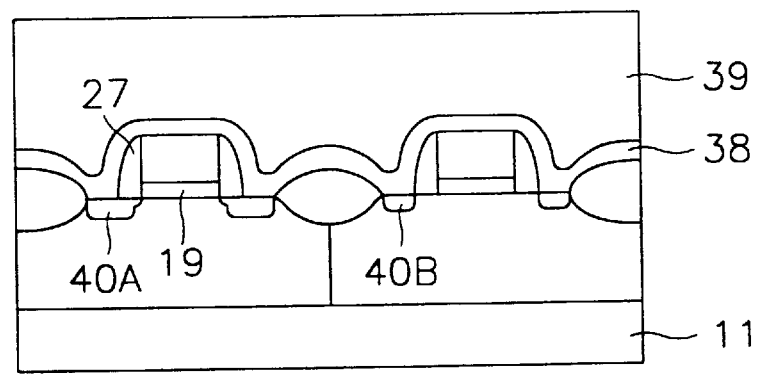

Thereafter, as shown in FIG. 2D, the third photoresist film pattern 35 is removed, followed by the removal of the residual oxide 29 by use of an HF solution which gives no damage to the semiconductor substrate 11. Then, the semiconductor substrate 11 is subjected to a rapid thermal process in which a nitrogen atmosphere is heated at an elevation speed of 30° C./sec or higher to a temperature of about 750°–1,050° C. and maintained at the temperature for 2–60 sec. A TEOS oxide 38, serving as an interlayer insulating film, is deposited with a thickness of 300–1,000 Angstrom, followed by the deposition of a blanket of a BPSG insulating film over the TEOS oxide 38. The BPSG insulating film 39 may be formed by a plasma enhanced chemical vapor deposition process, an atmospheric pressure chemical vapor deposition process or a low pressure chemical vapor deposition process. Then, a tube thermal treatment is executed to form an n$^+$ source/drain junction region in the p well 13 and a p$^+$ source/drain junction region in the n well 15, simultaneously at a temperature of 750°–900° C. for 10–90 min.

Here, the rapid thermal process which is carried out at a high temperature range for a short time makes the point defects, such as silicon-interstitial and vacancy, both occurring by the ion implantation, to be inter-coupled and thus removed, preventing the diffusion of dopants which may be caused by the defects upon the subsequent tube thermal treatment. Therefore, the depth of the junction can remain shallow, and the junction leakage current can be reduced as the number of defects decreases.

Figure 3:
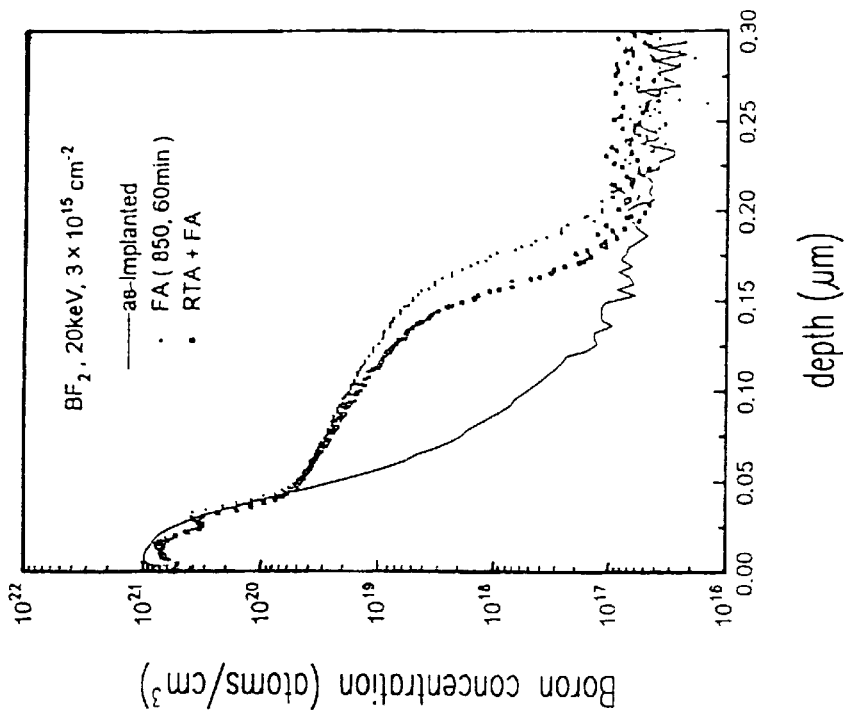
FIG. 3 illustrates depth distribution curves of boron according to a conventional method and the present invention.
Figure 3:
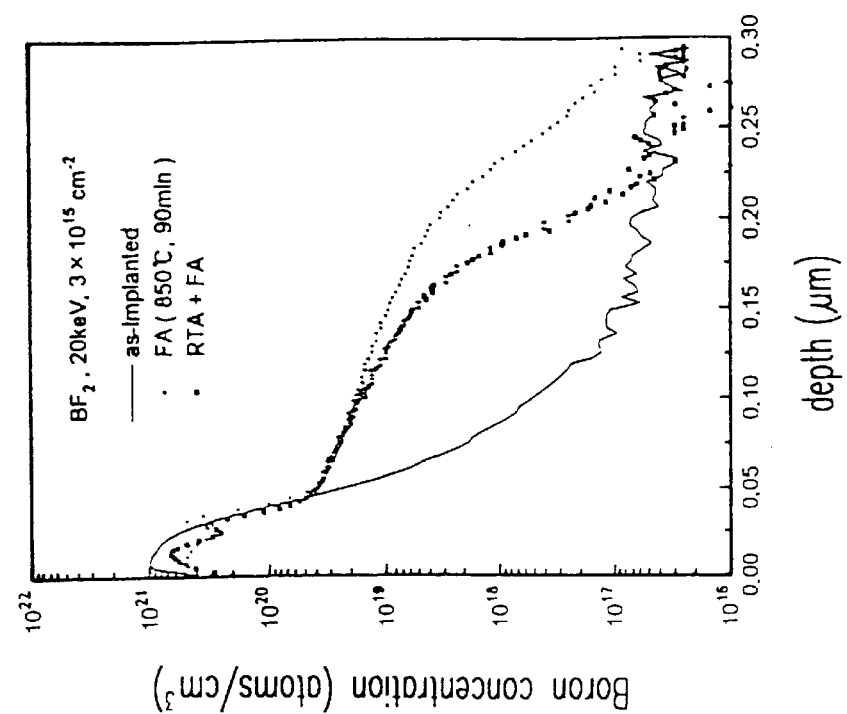

FIG. 3 is curves showing how impurity ions implanted in semiconductor substrate are distributed according to a conventional method and the present method. As seen in the FIG. 3, an addition of a rapid thermal process performed at 950° C. for 5 sec to the same condition of ion implantation and tube thermal treatment with that in the conventional method results in a depth distribution of boron much shallower than that obtained by the conventional method.

As described hereinbefore, a junction which is much shallower, with lower sheet resistance and less junction leakage current can be obtained even under the same ion implantation and tube treatment conditions as those of a conventional method by the present invention. This contributes to an improvement in the production yield of a semiconductor device. In addition, by virtue of the elimination of the point defects through the rapid thermal process, the limits in selecting the tube thermal treatment temperature and time for planarizing the subsequent interlayer insulating film can be relieved, so that process allowance can be secured, thereby improving the properties and the reliability of the semiconductor device and allowing the high integration of a semiconductor device.

Many modifications and variations of the present invention are possible in light of the above teachings. Therefore, it is to be understood that within the scope of the appended claims, the invention may be practiced in ways other than those specifically described.

What is claimed is:

1. A method for forming a shallow junction of a semiconductor device, comprising:

a) constructing a transistor structure including an element-isolating film, a gate oxide and a gate electrode on a semiconductor substrate;

b) depositing a first insulating film over an active region of the semiconductor substrate;

c) implanting impurity ions in the active region, to form an impurity ion-implanted region;

d) removing the first insulating film;

e) after implanting the impurity ions into the active region, subjecting the semiconductor substrate to a rapid thermal process that is defined by:
   1) a temperature of 750°–1050° C.;
   2) a duration of from 2 to 60 seconds; and
   3) a temperature elevation speed of at least 30° C. per second;

f) forming in sequence, a second insulating film and a third insulating film over a resulting structure, the second and the third insulating films serving as an interlayer insulating film and a planarization film, respectively; and g) subjecting the semiconductor substrate to a tube thermal treatment to change the impurity ion-implanted region into a shallow source/drain junction region. A method for forming a shallow junction of a semiconductor device, comprising the steps of:

constructing a transistor structure including an element-isolating film, a gate oxide and a gate electrode on a semiconductor substrate;

depositing a first insulating film at a thickness over an active region of the semiconductor substrate;

implanting a predetermined amount of impurity ions at a constant implantation energy in the active region, to form an impurity ion-implanted region;

removing the first insulating film; subjecting the semiconductor substrate to a rapid thermal process for a short time;

forming a second insulating film and a third insulating film over the resulting structure, in sequence, the second and the third insulating films serving as an interlayer insulating film and a planarization film, respectively; and subjecting the semiconductor substrate to a tube thermal treatment to change the impurity ion-implanted region into a shallow source/drain junction region.

2. A method in accordance with claim 1, wherein said first insulating film is an oxide 50–200 Angstrom thick.

3. A method in accordance with claim 1, wherein said impurity ion-implanted region is formed by implanting arsenic ions at an amount of 1E15–5E15 ions/cm$^2$ with an energy of 10–40 KeV.

4. A method in accordance with claim 1, wherein said impurity ion-implanted region is formed by implanting boronfluoride ions at an amount of 1E15–5E15 ions/cm$^2$ with an energy of 5–40 KeV.

5. A method in accordance with claim 1, wherein said impurity ion-implanted region is formed by implanting boron ions at an amount of 1E15–5E15 ions/cm$^2$ with an energy of 2–10 KeV.

6. A method in accordance with claim 1, wherein said first insulating film is removed in a wet manner using a HF solution.

7. A method in accordance with claim 1, wherein said second insulating film is a tetraethylorthosilicate insulating film having a thickness of 300–1,000 Angstrom.

8. A method in accordance with claim 1, wherein said third insulating film is formed by a plasma enhanced chemical vapor deposition process, an atmospheric pressure chemical vapor deposition process or a low pressure chemical vapor deposition process.

9. A method in accordance with claim 1, wherein said tube thermal treatment is carried out at a temperature of 750–900° C. for 10–90 min.

* * * * *